United States Patent [19]
Mukai

[11] Patent Number: 5,899,746
[45] Date of Patent: May 4, 1999

[54] METHOD OF FORMING PATTERN

[75] Inventor: Mikio Mukai, Kanagawa, Japan

[73] Assignee: Sony Corporation, Japan

[21] Appl. No.: 08/697,732

[22] Filed: Aug. 29, 1996

[30] Foreign Application Priority Data

Sep. 8, 1995 [JP] Japan ..................................... 7-257158
Apr. 19, 1996 [JP] Japan ..................................... 8-122179

[51] Int. Cl.$^6$ ................................................. H01L 21/302
[52] U.S. Cl. ......................... 438/700; 438/702; 438/947; 438/942; 430/314; 430/316
[58] Field of Search ................................... 438/700, 701, 438/702, 947, 942, FOR 389, FOR 132; 430/314, 316

[56] References Cited

U.S. PATENT DOCUMENTS 4,022,932  5/1977  Feng ........................................... 427/93
4,449,287  5/1984  Maas et al. ................................ 29/580

FOREIGN PATENT DOCUMENTS 356043639  4/1981  Japan .
403188628  8/1991  Japan ..................................... 430/314
404143765  5/1992  Japan .

*Primary Examiner*—Charles Bowers
*Assistant Examiner*—Matthew Whipple
*Attorney, Agent, or Firm*—Ronald P. Kananen

[57] ABSTRACT

A base is etched using as mask a first masking layer which has been patterned, softened and deformed. Then, the first masking layer is eroded, a second masking layer is self-aligningly formed only on bare portions of the base, and the base is again etched using as mask the second masking layer. Within a pitch of the first masking layer, the base can thus be etched in two regions which are separated from each other. These treatments can also be conducted in two directions.

10 Claims, 4 Drawing Sheets

METHOD OF FORMING PATTERN

BACKGROUND OF THE INVENTION

1. Field of the Invention

The invention of the present application relates to a method of forming a pattern on manufacturing a semiconductor device.

2. Description of the Related Art

For a miniaturization of a semiconductor device, technology of forming fine pattern has to be developed. Presently, a resist patterned by lithography is generally used as masking layer in etching for forming a pattern. Thus, minuteness of a pattern will be limited by resolution limit of lithography so long as one uses lithography as it is presently used.

Some related art (e.g., Japanese Patent Laid-Open Publication No. 364021/1992) discloses an example of forming a pattern having a narrower interval than the resolution limit of lithography, wherein the opening of the resist patterned up to the resolution limit of lithography is narrowed by softening and deforming (by heating) and etching is effected using as mask this deformed resist.

In this related art, however, while the width of the opening can be narrowed, the width of a covering portion on the resist is increased so that the width of remaining portions after etching becomes increased. For this reason, the pitch of line-and-space pattern remained unchanged, i.e., as a whole, no formation of pattern with higher resolution than the resolution limit of lithography was achieved.

SUMMARY OF THE INVENTION

A first point of the present invention is as follows: a first masking layer having fluidity is after patterning by the conventional lithography softened and deformed such that a finer opening is formed than that of the pattern formed by the conventional lithography, and a base is etched using this finer opening. Then, the first masking layer is eroded such that the pattern is made slender, thereafter a second masking layer is formed. By removing the first masking layer then, pattern of the second masking layer is selfaligningly formed. Thereafter, the base is etched using as mask the pattern of the second masking layer. According to this process, within a pitch of the first masking layer, the base can be etched in two regions which are separated from each other. Thus, a linear pattern having half so large pitch as that of the first masking layer can be formed.

A fine pattern obtained in this way has a finer width of the opening and a finer distance between neighboring openings than the corresponding quantity of a pattern obtained by the conventional lithography. Further, by proper choice of the etching method, a linear pattern can be made to have an either rectangular or triangular section.

A second point of the present invention is as follows: by applying the process mentioned in the above first point of the present invention for several times, a point-like pattern having half so large pitch as that of the first masking layer can be formed. Further, by proper choice of the etching method, a point-like pattern can be made to have an either rectangular or triangular section.

BRIEF DESCRIPTION OF THE DRAWINGS

FIGS. 4A and 4B are side sectional views of a fourth embodiment of the invention of the present application, wherein FIG. 4A is a side sectional view halfway in the manufacturing steps while FIG. 4B is a plan view after the last manufacturing step.

DETAILED DESCRIPTION OF THE PREFERRED EMBODIMENTS

Referring to FIGS. 1A to 4B, there will in the following be explained the first to third embodiments applied to the formation of a line-and-space pattern of the invention of the present application as well as the fourth embodiment applied to the formation of a dot pattern of the invention of the present application.

Figure 1A:
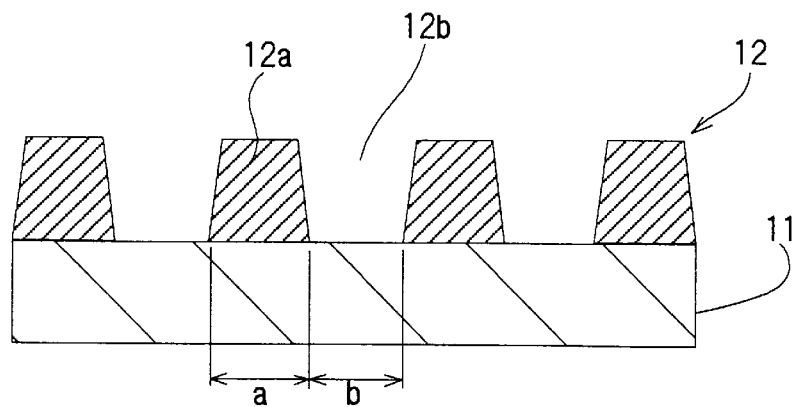
FIGS. 1A to 1H are side sectional views of a first embodiment of the invention of the present application, showing sequentially the manufacturing steps of this embodiment one after another.

FIGS. 1A to 1H show the first embodiment. In this first embodiment, as shown in FIG. 1A, there is on an Si base 11 formed by the conventional lithography using g line, i line, excimer laser or the like a resist 12 in which a covering portion 12a having the width a and an opening 12b having the width b are located in one and same direction in regular succession.

Figure 1B:
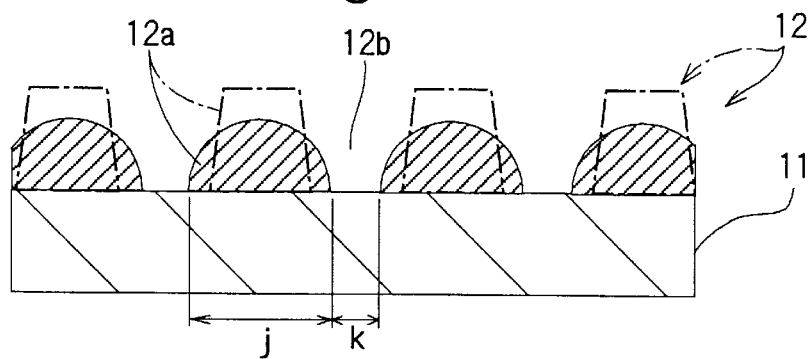
Figure 1C:
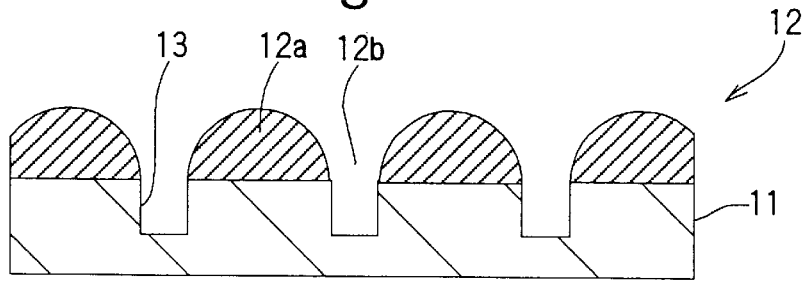

Next, by softening and deforming the resist 12 by a heat treatment, width of the covering portion 12a is increased to j while width of the opening 12b is decreased to k, as shown in FIG. 1B. Subsequently, by anisotropically etching the Si base 11 with a gas such as $CF_4$ or the like using the resist 12 as mask, a groove 13 having a rectangular section is formed in the Si base 11, as shown in FIG. 1C.

Figure 1D:
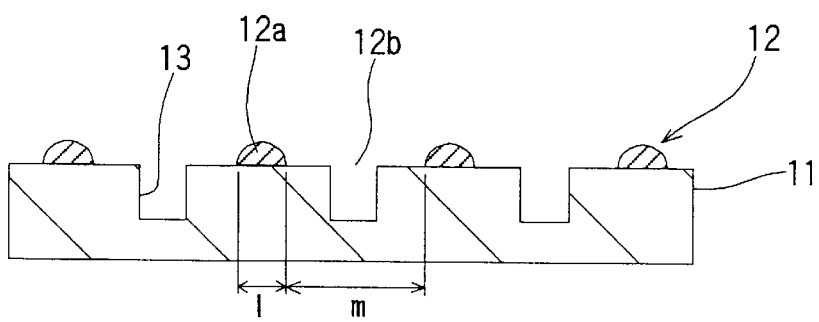
Figure 1E:
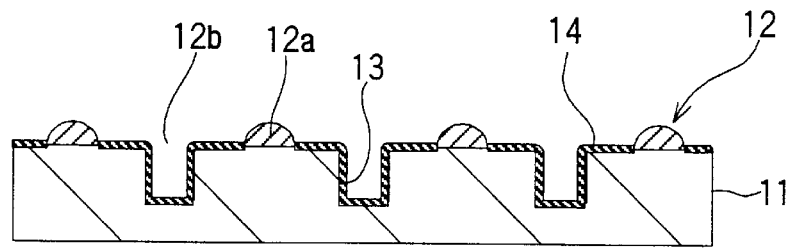

Next, by half-way ashing the resist 12, width of the covering portion 12a is decreased to l while width of the opening 12b is increased to m, as shown in FIG. 1D. Thereafter, a native oxide layer 14 having a thickness of about 1 to 3 nm is formed only on bare portions of the Si base 11 not covered by the resist 12, as shown in FIG. 1E.

Figure 1F:
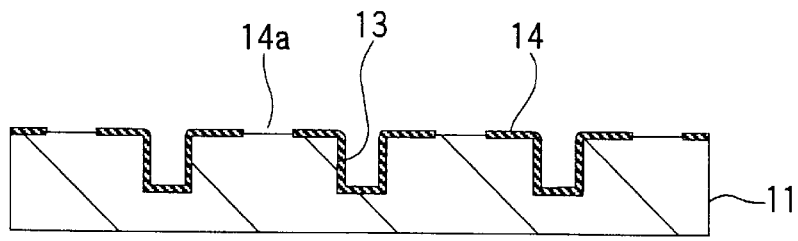

By thermal oxidation at such temperatures as to keep the resist 12 undeformed, instead of forming the native oxide layer 14 an $SiO_2$ layer may also be formed only on bare portions of the Si base 11 not covered by the resist 12. By a subsequent removal of the resist 12 as shown in FIG. 1F, an opening 14a having a width of l is formed in the native oxide layer 14.

Figure 1G:
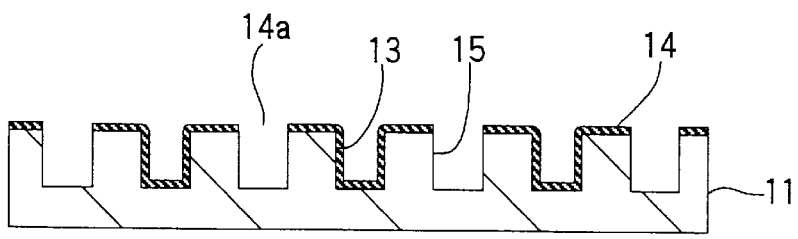

Next, by anisotropically etching the Si base 11 with gas such as $SF_6+N_2$ or the like using the native oxide layer 14 as mask, a groove 15 having a rectangular section is formed in the Si base 11, as shown in FIG. 1G. Then, by a subsequent removal of the native oxide layer 14 with hydrofluoric acid or the like, a line-and-space pattern is formed in the Si base 11.

Figure 2A:
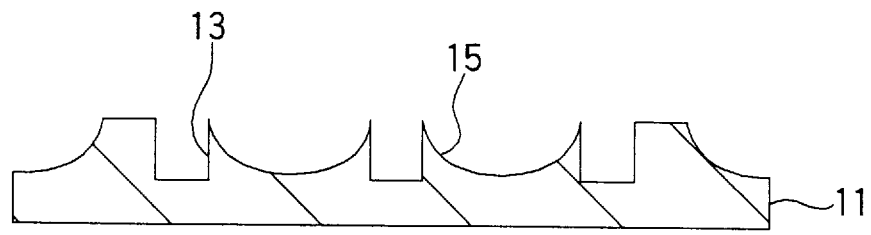
FIGS. 2A and 2B are side sectional views of a pattern formed by a second embodiment of the invention of the present application, wherein the patterns of FIGS. 2A and 2B are shifted by a half period from each other.
Figure 2B:
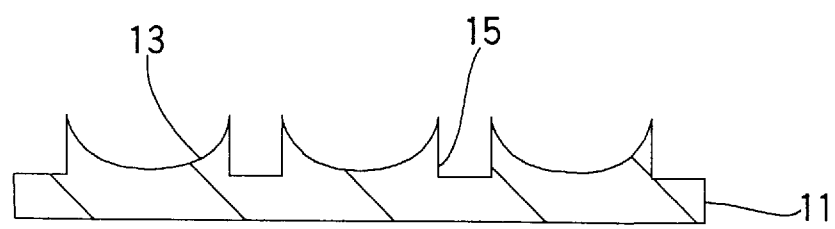

FIGS. 2A and 2B show the second embodiment. FIG. 2A corresponds to a case where, by applying isotropic etching instead of anisotropic etching in the step of FIG. 1G, a groove 15 having a valley-like section is formed. FIG. 2B corresponds to another case where, by applying isotropic etching instead of anisotropic etching in the step of FIG. 1C, a groove 13 having a valley-like section is formed, whereby the pattern is shifted by a half period relative to that of FIG. 2A.

Figure 3:
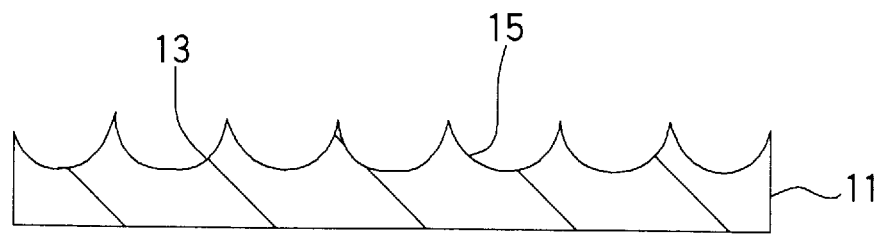
FIG. 3 is a side sectional view of a pattern formed by a third embodiment of the invention of the present application.

FIG. 3 shows the third embodiment. In the third embodiment, by applying isotropic etching instead of anisotropic etching in the steps of both FIGS. 1C and 1G, grooves 13 and 15 having valley-like sections are formed.

Figure 1H:
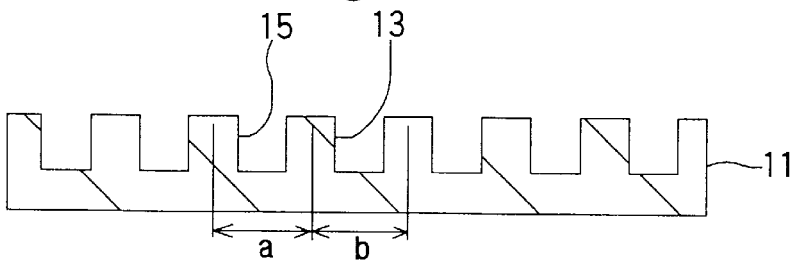
Figure 4A:
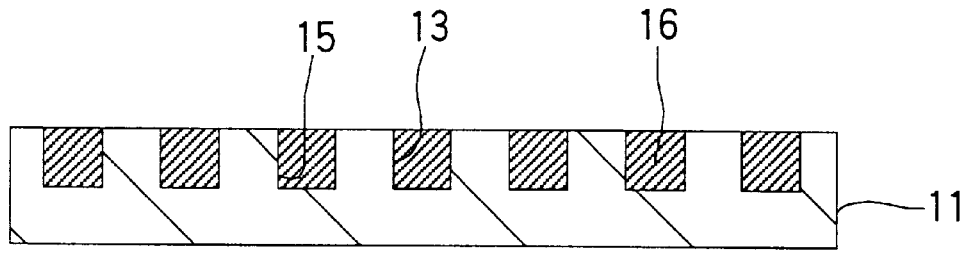
Figure 4B:
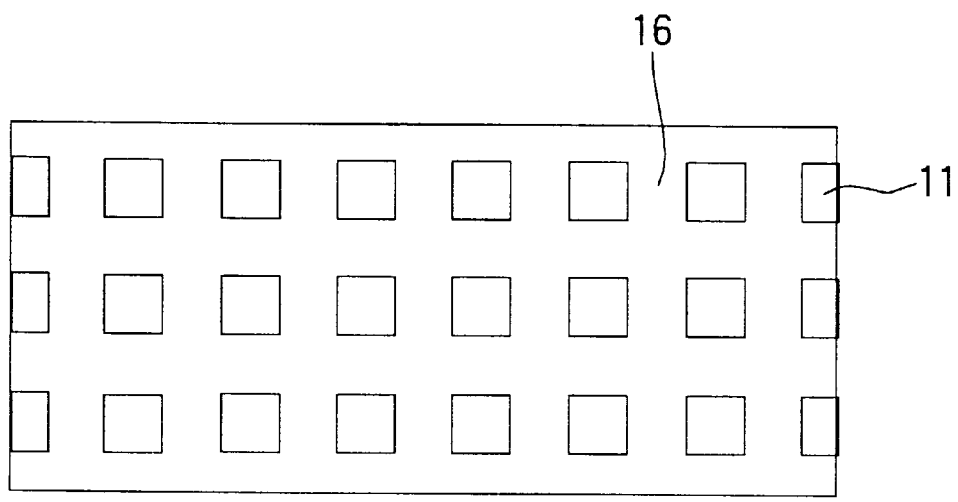

FIGS. 4A and 4B show the fourth embodiment. In the fourth embodiment, too, essentially the same steps are followed as those of the first embodiment until a pattern comprising the grooves 13 and 15 having rectangular sections is formed on the surface of the Si base 11 as shown in FIG. 1H. But subsequently in the fourth embodiment, an $SiO_2$ layer 16 is deposited on the Si base 11 by a CVD process using as raw material TEOS or the like, thereafter the $SiO_2$ layer 16 is polished until the grooves 13 and 15 are just filled up as shown in FIG. 4A.

Then, on the Si base 11 and the $SiO_2$ layer 16 there is patterned a resist (not shown in the drawings) whose direction of repetition of the covering portion and the opening crosses at right angle that of the resist 12 in the abovementioned first embodiment, thereafter the steps of FIGS. 1A to 1H are again processed. As a result of this, a matrix-like aligned dot pattern is formed out of the Si base 11.

In the first to fourth embodiments explained so far, the two grooves 13 and 15 separated from each other can be formed within the initial pitch a +b of the resist 12 formed by lithography, as is obvious from FIG. 1H. Accordingly, if the pitch a +b of the resist 12 is equal to the resolution limit of lithography, a line-and-space or dot can be formed with twice as large resolution as the resolution limit of lithography.

To sum up, while a line-and-space of, e.g., 0.2 $\mu$m/0.2 $\mu$m is formed with the presently available resolution limit of lithography using the conventional lithography, a line-and-space or dot of about 0.1 $\mu$m/0.1 $\mu$m can be formed with the same resolution limit of lithography using the inventive method and, thereby can be easily obtained a pattern corresponding to technology possibly advanced by two generations.

In the fourth embodiment as shown in FIGS. 4A and 4B, too, there may be formed not only grooves 13 and 15 having rectangular sections but also grooves 13 and 15 having valley-like sections, analogous to the second and third embodiments as shown in FIGS. 2A to 3. Further, while an Si base 11 is employed in all of the first to fourth embodiments, a compound semiconductor base or the like can instead of the Si base 11 be employed as well.

What is claimed is:

1. A method of forming a pattern, characterized in comprising the steps of:

forming on a base a first masking layer in which a covering portion having a first width and an opening having a second width are located in one and same direction in regular succession;

altering, by softening and deforming said first masking layer, said first width of said covering portion to a third width which is larger than said first width and said second width of said opening to a fourth width which is smaller than said second width;

effecting a first etching on said base using as mask said first masking layer having said covering portion with said third width and said opening with said fourth width;

altering, by eroding said first masking layer after said first etching, said width of said covering portion to a fifth width which is smaller than said first width and said width of said opening to a sixth width which is larger than said second width;

selfaligningly forming relative to said base, after said eroding, a second masking layer which covers bare portions of said base in said opening;

removing said first masking layer after said forming said second masking layer; and effecting a second etching on said base using as mask said second masking layer after said removing said first masking layer.

2. A method of forming a pattern according to claim 1, characterized in using as said first masking layer a resist and as said second masking layer an oxide layer formed by oxidizing said bare portions of said base.

3. A method of forming a pattern according to claim 1, characterized in that said first and second etchings are isotropic ones.

4. A method of forming a pattern according to claim 1, characterized in that said first and second etchings are anisotropic ones.

5. A method of forming a pattern according to claim 1, characterized in that one of said first and second etchings is isotropic one, while the other is anisotropic one.

6. A method of forming a pattern according to claim 1, characterized in comprising the steps of:

removing said second masking layer after said second etching;

filling up etched portions of said base with insulating layer after said removing said second masking layer; and effecting once again, after said filling up said etched portions of said base with said insulating layer, said steps of forming said first masking layer up to effecting said second etching, wherein a different direction of repetition of the covering portion and the opening is adopted from that adopted before.

7. A method of forming a pattern according to claim 6, characterized in using as said first masking layer a resist and as said second masking layer an oxide layer formed by oxidizing said bare portions of said base.

8. A method of forming a pattern according to claim 6, characterized in that said first and second etchings are isotropic ones.

9. A method of forming a pattern according to claim 6, characterized in that said first and second etchings are anisotropic ones.

10. A method of forming a pattern according to claim 6, characterized in that one of said first and second etchings is isotropic one, while the other is anisotropic one.

* * * * *

UNITED STATES PATENT AND TRADEMARK OFFICE
CERTIFICATE OF CORRECTION

PATENT NO. : 5,899,746
DATED : May 4, 1999
INVENTOR(S) : Mikio MUKAI

It is certified that error appears in the above-identified patent and that said Letters Patent is hereby corrected as shown below:

Column 1, line 25, -- the - should be inserted before "remaining".

Column 1, line 27, "remained" should read -- remains --.

Column 1, line 29, "was" should read - is --.

Column 1, line 34, -- softened - should be inserted before "after".

Column 1, line 35, "softened" should be deleted.

Column 1, line 39, -- and -- should be insert before "thereafter".

Column 1, line 41, "selfaligningly" should read -- self-aligningly --.

Column 1, line 42, "as mask" should be deleted.

Column 1, line 43,-- as the mask - should be inserted after "layer".

Column 1, line 46, "so large" should read - as large a --.

Column 1, line 50 "the" (second occurrence) should be deleted.

Column 1, line 56, "for" should be deleted.

Column 1, line 57, "so large" should read - as large a --.

Column 3, line 10, "like, thereafter," should read -- like.

Thereafter, --

Column 3, line 16, "at right angle" should read - a right angle from --.

Column 3, line 17, "embodiment, thereafter" should read - embodiment.

Thereafter --.

UNITED STATES PATENT AND TRADEMARK OFFICE
CERTIFICATE OF CORRECTION

PATENT NO. : 5,899,746
DATED : May 4, 1999
INVENTOR(S) : Mikio MUKAI It is certified that error appears in the above-identified patent and that said Letters Patent is hereby corrected as shown below:

Column 1, line 12, "as" should be as a --.

Column 1, line 14, "will be" should read -- is --.

Column 1, line 19 should be:

-- of lithography. The opening of the resist patterned up --.

Column 1, line 21, "deforming (by heating)" should read

-- deforming process (e.g., by heating) --.

Column 1, line 22, should read - using this deformed resist as the

-- mask --.

Signed and Sealed this

Eleventh Day of January, 2000

*Attest:*

Q. TODD DICKINSON

*Attesting Officer*   *Acting Commissioner of Patents and Trademarks*